(12) United States Patent
Pozdnyakov et al.

(10) Patent No.: US 7,809,237 B2
(45) Date of Patent: Oct. 5, 2010

(54) LENS FOR REFORMING LIGHT-EMITTING DIODE RADIATION

(75) Inventors: Vadim Viktorovich Pozdnyakov, Moscow (RU); Maxim Evgein'evich Frolov, Moscow (RU); Alexey Mikhailovich Khorokhorov, Moscow (RU); Alexander Fedorovich Shirankov, Pushkino (RU); Ju-Young Yoon, Kyoungki-do (KR); Gi-Cherl Kim, Kyoungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/639,511

(22) Filed: Dec. 14, 2006

(65) Prior Publication Data
US 2007/0183736 A1  Aug. 9, 2007

(30) Foreign Application Priority Data
Dec. 15, 2005  (RU) .............................. 2005139144

(51) Int. Cl.
*G02B 6/10* (2006.01)
(52) U.S. Cl. ........................... 385/146; 385/15; 385/31; 385/33
(58) Field of Classification Search ................... 385/15, 385/31, 33, 146
See application file for complete search history.

(56) References Cited

U.S. PATENT DOCUMENTS

| 2,908,197 | A | * | 10/1959 | Wells et al. | 340/815.76 |
| 6,679,621 | B2 | * | 1/2004 | West et al. | 362/327 |
| 6,951,415 | B2 | * | 10/2005 | Amano et al. | 362/520 |
| 7,217,022 | B2 | * | 5/2007 | Ruffin | 362/554 |
| 2006/0060867 | A1 | * | 3/2006 | Suehiro | 257/81 |
| 2007/0114551 | A1 | * | 5/2007 | Kawaguchi et al. | 257/98 |

\* cited by examiner

*Primary Examiner*—Jennifer Doan
(74) *Attorney, Agent, or Firm*—Innovation Counsel LLP

(57) ABSTRACT

A lens for reforming radiation from a light-emitting diode having a first convex surface for admitting radiation path from the light-emitting diode that is close to the axis of the diode and a cylindrical surface for admitting radiation that makes a wider angle with the axis of the diode, a conical surface disposed to receive and totally internally reflect radiation admitted by said convex surface and re-radiate it at an angle substantially normal to the axis of the diode and a curved surface for receiving and re-radiating at an angle substantially normal to the axis of the diode radiation admitted by the cylindrical surface.

13 Claims, 3 Drawing Sheets

US 7,809,237 B2

LENS FOR REFORMING LIGHT-EMITTING DIODE RADIATION

REFERENCE TO RELATED APPLICATION

This application claims the benefit and priority of Patent Application. No. RU2005139144 filed Dec. 15, 2005 in the Patent Office for the Russian Federation.

1. Field of the Invention

The invention relates to optical systems, and more particularly to systems for adapting light-emitting diodes for use in color liquid crystal displays.

2. Background of the Relevant Art

Lighting systems for color liquid crystal displays (LCDs) based on light-emitting diodes offer a wide range of colors and greater compactness compared to lighting systems based on fluorescent lamps. However there has been a problem in maintaining an effective mixture of radiation from separate light-emitting diodes so as to uniformly illuminate the LCD screen. In practice light-emitting diodes are employed with special lenses which direct radiation from the diodes mainly to a plane parallel to the highlighted screen. Thereafter, a wave guide focused in parallel to the screen mixes the radiation from the plurality of diodes to provide the required uniform illumination of the screen.

For example, FIG. 1 schematically depicts the radiation diverting lens shown in prior art U.S. Pat. No. 6,679,621B2 issued Jan. 24, 2002. The lens has three surfaces A, B and C and functionally consists of a central part and a peripheral part. Beams 2 generated by the radiating platform of light-emitting diode F, enter surface A and pass through the central part of the lens where they undergo internal refraction. Beams 2 undergo full internal reflection at surface B and are refracted upon exiting at surface C. Beams 2 exit the lens mainly normal to the lens axis. Beams 1 which enter surface at the peripheral part of the lens, undergo refraction and exit the lens at surface C, also mainly normal to the lens axis.

To ensure the full internal reflection of beams 2 on surface B, surface B of the lens has a concave funnel shape, i.e., the perimeter of the funnel shape is more normal to the optical axis of the lens than the center of the funnel, However this aspect of surface B does not provide sufficient internal reflection for those beams coming from extra-axial points of the radiating platform and so off-axis beams leave the lens at angles closer to the axis of the lens rather than more normal to the axis of the lens.

FIG. 2 shows the typical intensity distribution versus radiation angle for light from a light-emitting diode equipped with the above-described prior art lens. From FIG. 2, it is apparent that the lens fails to solve the entire problem. In particular, the light power in a direction of the axis and within the limits of ±40° around the axis is only about 20% of maximal. It means that the share of the radiation stream generated at normal to optical axis of the lens, decreases. Because of this, the light-emitting diode with such forming lens will be visible through the screen as a bright point. To reduce these bright points it is necessary to install additional opaque screens over the light-emitting diodes, the sizes of such screens exceeding the size of the lens.

BRIEF SUMMARY OF THE INVENTION

In accordance with an illustrative embodiment of the invention the foregoing technical problem for reforming radiation from a light-emitting diode is solved by a radiation reforming lens having four external surfaces including first convex and second cylindrical surfaces receiving light from the light emitting diode, the first convex surface producing full internal reflection which exits a third, conical lens surface mainly normal to the optical axes of the lens and light emitting diode, the cylindrical surface causing the entering light to be refracted so as to exit a fourth convex surface in a direction mainly normal to the optical axes of the lens and light emitting diode thereby reducing the amount of radiation stream near the axis of the reforming lens.

BRIEF DESCRIPTION OF THE DRAWING

The foregoing and other objects, features and advantages of the invention may become more apparent from a reading of the ensuing description together with the drawing, in which.

Figure 4:
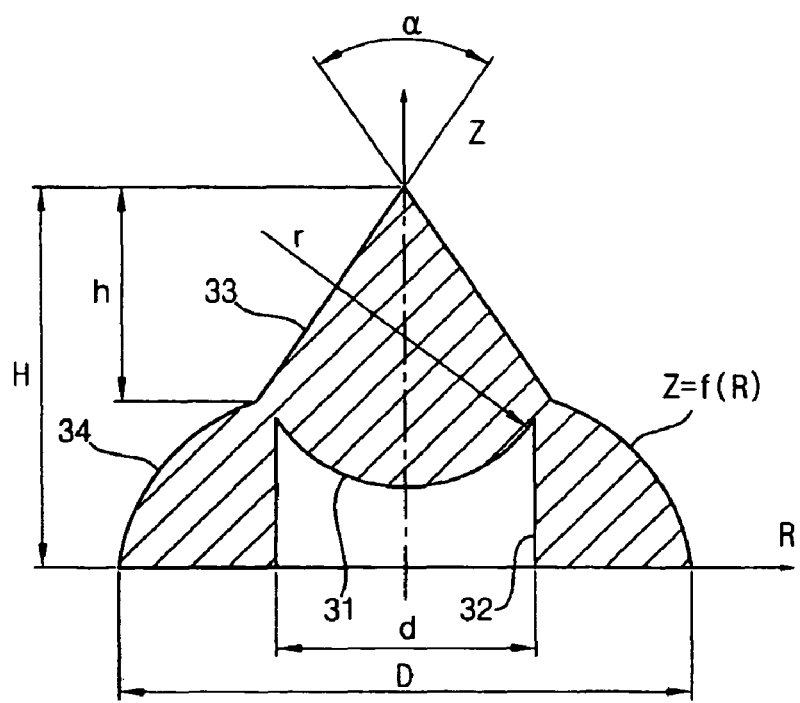
FIG. 4—An alternative embodiment of a radiation reforming lens according to the present invention.

Table 1—Design data of the variant presented on FIG. 4

Table 2—the structure (cross-section) of the aspheric surface of a lens variant as on FIG. 4.

DESCRIPTION

Figure 1:
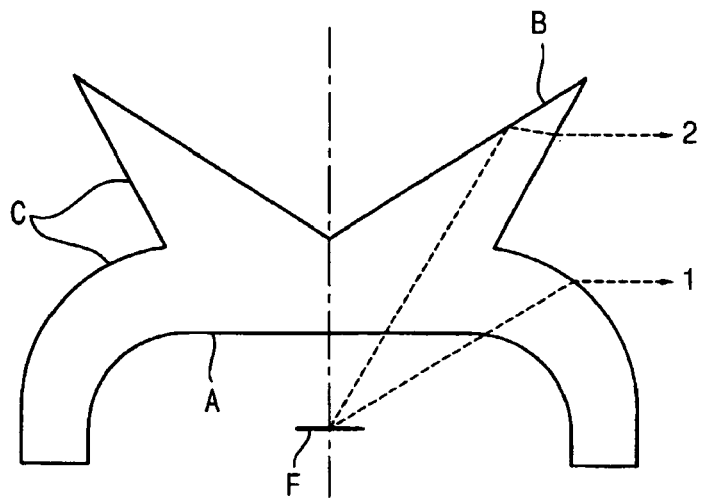
FIG. 1—Schematic diagram of radiation reforming lens illustrated in prior art U.S. Pat. No. 6,679,621B2.
Figure 2:
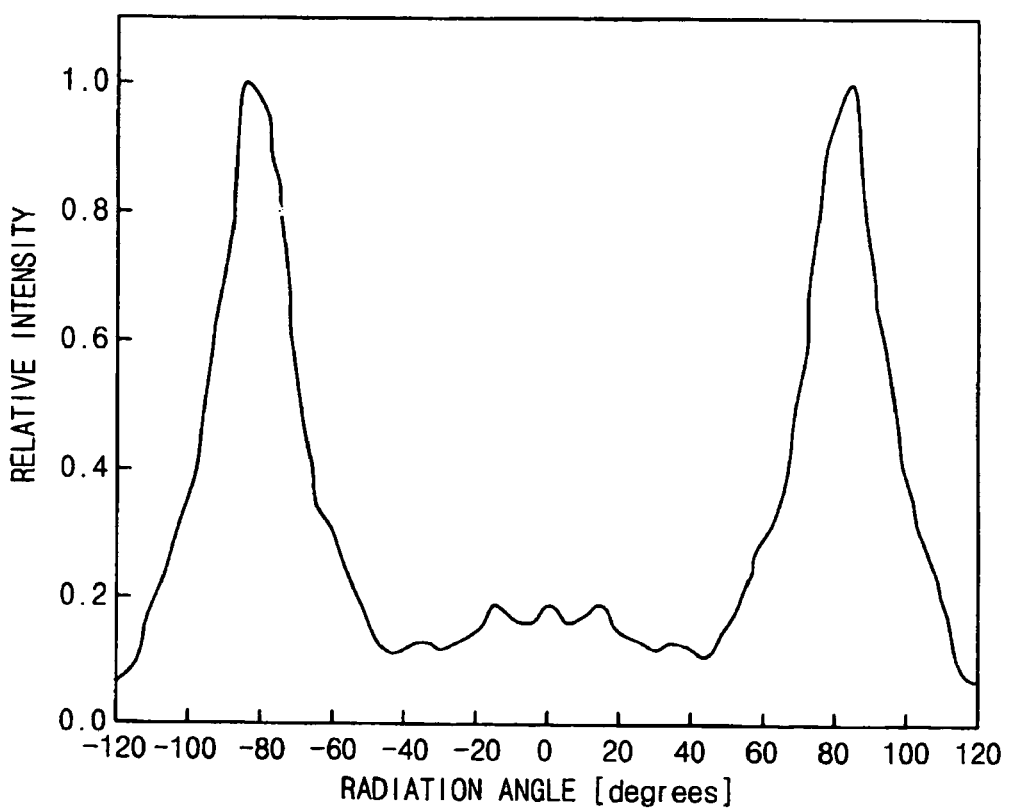
FIG. 2—Distribution of the light power by the prior art radiation reforming lens.
Figure 3:
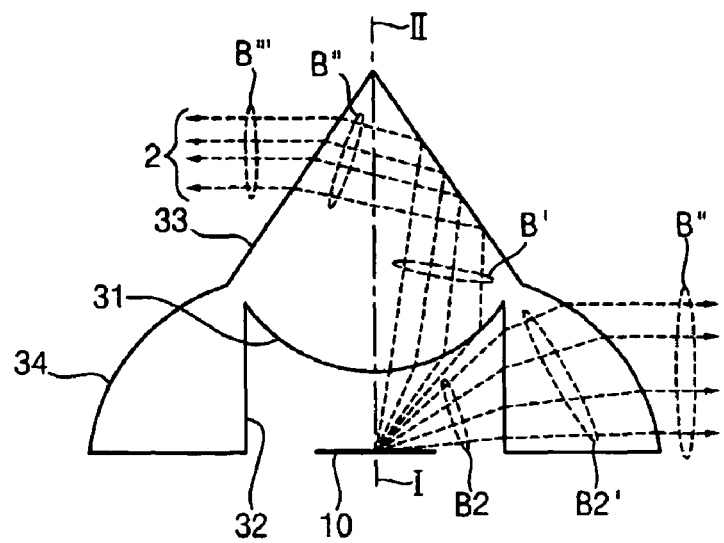
FIG. 3—Illustrative embodiment of a radiation reforming lens according the present invention.

FIG. 3 depicts a first illustrative embodiment of a light reforming lens 30 according to the principles of the invention. A light emitting diode (LED) 10 emits radiation along a principal axis I. Other lobes of radiation may be, and usually are, present but are omitted at this time for purposes of more simply explaining the principles of the invention. The optical axis II of lens 30 is positioned to be collinear with the principal radiation axis I of LED 10o.

Lens 30 advantageously has four surfaces. Surface 31 is a curved light admitting surface having central and peripheral zones with the central zone being disposed on axis I of diode 10. Advantageously surface 31 presents a convex curvature to light radiated from diode 10. Surface 31's central zone is closer to diode 10 than its peripheral zone.

Beams B1 emitted from diode 10 at angles close to axis I enter surface 31. The beams are refracted as B1' and impinge upon surface 33 where they advantageously undergo total internal reflection becoming B1". At surface 33, the beams upon exiting as B1''' are again refracted emerging substantially normal to axis II.

Beams B2 emitted from diode 10 at angles diverging from axis I enter curved surface 32 of lens 30 which is advantageously cylindrical. The beams are refracted as beams B2' and encounter light exiting aspheric surface 34 where they emerge as beams B2" and are refracted once again. Emergent beams B2" are also substantially normal to axis II.

An example of a practical embodiment of the forming lens is presented in FIG. 4 as an axial section of the lens. FIG. 4 is intended t be read together with the exemplary values set forth in Table. In FIG. 4, the dimension "H" is the total height of the lens; "α" and "h" are, respectively the cone angle and height of surface 33 and the height of radius of curvature of surface 31. "D" is the external diameter at the basis of the lens, and "d" is the internal diameter of cylindrical surface 32 at the basis of the lens, and "r" is the radius of curvature of the central zone of surface 31 of the lens.

Axes Z and R are axes of the Cartesian system of coordinates in which the external aspheric surface of rotation around axis Z is set by function Z=f (R). The contour of aspheric surface 34 is defined by the function Z=f (R), where R is the distance along its major diameter. Table 1 shows the values of technical parameters of one of the practical implementations of the lens. Coordinates of aspheric surface 34 are given by R and Z=f (R) for points are presented in table 2.

TABLE 1

Technical parameters

| Parameter | Value |
|---|---|
| D | 5.5 [mm] |
| d | 2.5 [mm] |
| α | 63.35° |
| H | 3.95 [mm] |
| h | 2.3 [mm] |
| r | 1.5 [mm] |

TABLE 2

| # | R | Z = f(R) |
|---|---|---|
| 1 | 2.7500 | 0.00 |
| 2 | 2.7490 | 0.05 |
| 3 | 2.7461 | 0.10 |
| 4 | 2.7413 | 0.15 |
| 5 | 2.7345 | 0.20 |
| 6 | 2.7257 | 0.25 |
| 7 | 2.7150 | 0.30 |
| 8 | 2.7022 | 0.35 |
| 9 | 2.6874 | 0.40 |
| 10 | 2.6706 | 0.45 |
| 11 | 2.6516 | 0.50 |
| 12 | 2.6305 | 0.55 |
| 13 | 2.6071 | 0.60 |
| 14 | 2.5814 | 0.65 |
| 15 | 2.5530 | 0.70 |
| 16 | 2.5231 | 0.75 |
| 17 | 2.4903 | 0.80 |
| 18 | 2.4548 | 0.85 |
| 19 | 2.4167 | 0.90 |
| 20 | 2.3758 | 0.95 |
| 21 | 2.3321 | 1.00 |
| 22 | 2.2852 | 1.05 |
| 23 | 2.2352 | 1.10 |
| 24 | 2.1818 | 1.15 |
| 25 | 2.1249 | 1.20 |
| 26 | 2.06430 | 1.25 |
| 27 | 1.99976 | 1.30 |
| 28 | 1.9311 | 1.35 |
| 29 | 1.8580 | 1.40 |
| 30 | 1.78040 | 1.45 |
| 31 | 1.6979 | 1.50 |
| 32 | 1.6104 | 1.55 |
| 33 | 1.5175 | 1.60 |
| 34 | 1.4193 | 1.65 |

Figure 5:
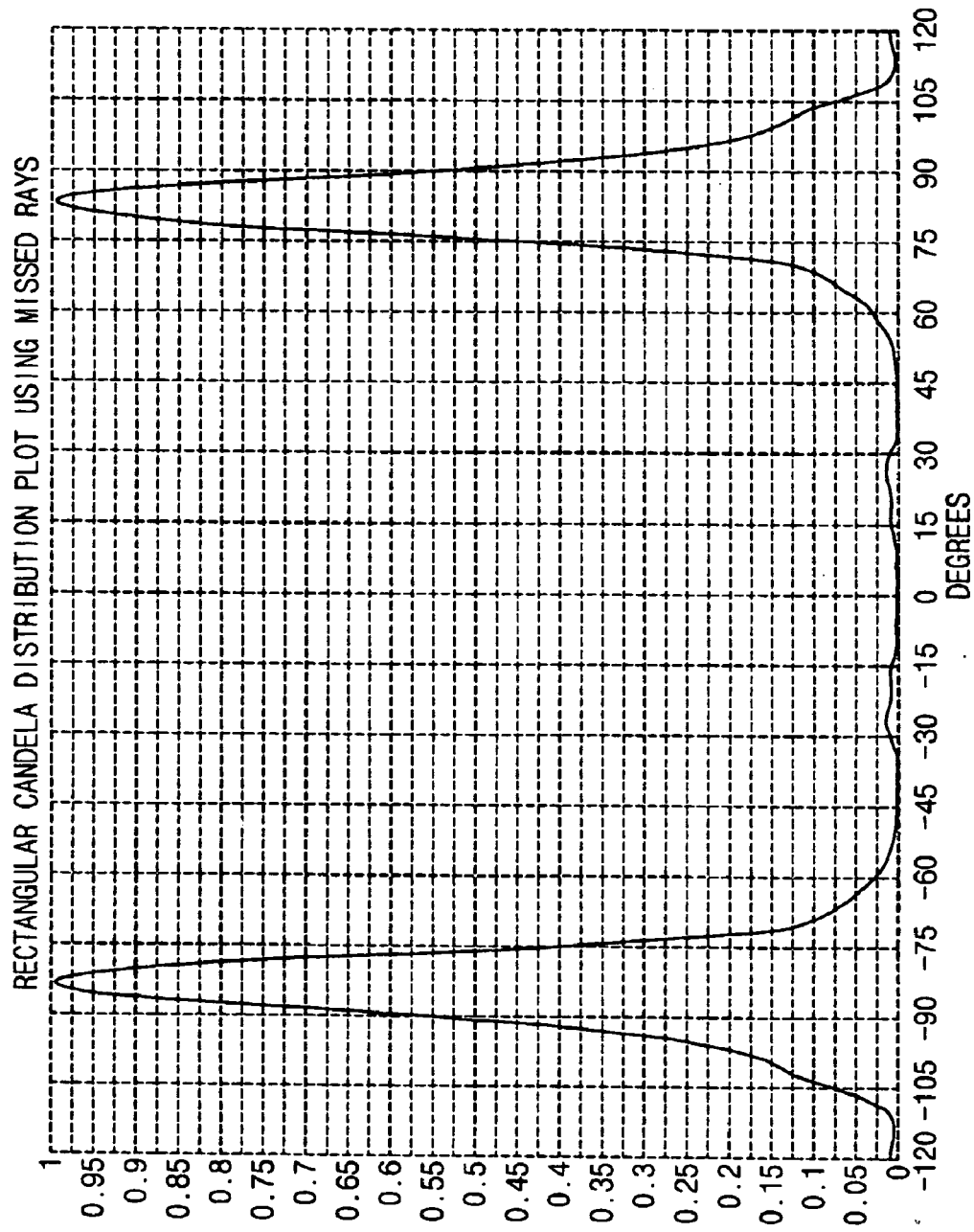
FIG. 5—Distribution of the light power from an embodiment of a radiation reforming lens according to the present invention.

FIG. 5 shows the graph of the light power distribution of a light-emitting diode equipped with the said forming lens. From the graph it is evident, that the illustrative embodiment within the range of angles ±45° ensures the reduction of the level of the parasitic radiation eight-fold or more. The root-mean-square value of the ambient radiation within the same range of angles is reduced more than 30-fold in comparison with the nearest analogue.

What has been described is deemed to be illustrative of the principles of the present invention. Further and other embodiments will be apparent to those of ordinary skill in the art and may be made without, however, departing from the spirit and scope of the invention.

What is claimed is:

1. A lens for reforming the radiation of a light-emitting diode, comprising:
at least one of a first convex surface disposed to admit radiation from a light-emitting diode and a second cylindrical surface disposed to admit radiation from the light-emitting diode;
a conical part into which radiation admitted by said first surface enters the conical part having an internal surface for reflecting the radiation and an external conical surface allowing said reflected radiation to exit; and
a curved part disposed opposite said cylindrical surface for allowing radiation admitted by said cylindrical surface to exit,
wherein a width of the conical part reduces as a distance from the first convex surface increases.

2. The lens according to claim 1 wherein the axis of said first convex surface is collinear with the axis of said light emitting diode.

3. The lens according to claim 2 wherein said first convex surface is disposed to receive radiation emitted at an angle close to the axis of said light emitting diode.

4. The lens according to claim 3 wherein said cylindrical surface is disposed to receive radiation emitted at greater angle to the axis of said diode than is received by said convex surface.

5. The lens of claim 1 where said radiation entering said first convex surface is internally totally reflected by said conical surface.

6. The lens of claim 2 wherein said radiation exiting from said conical surface exits at an angle substantially normal to the axis of said light emitting diode.

7. The lens of claim 4 wherein said radiation exiting said curved surface exits at an angle substantially normal to the axis of said light emitting diode.

8. A lens for reforming radiation from a light-emitting diode comprising:
a first convex surface for admitting radiation taking a path from the light-emitting diode that is close to the axis of the diode;
a cylindrical surface for admitting radiation taking a path from the light-emitting diode that makes a wider angle with the axis of the diode;
a conical surface disposed to form a conical part into which the radiation admitted by said convex surface enters and the conical surface totally internally reflecting and re-radiating the radiation an angle substantially normal to the axis of the diode; and
a curved surface for receiving and re-radiating the radiation admitted by the cylindrical surface at an angle substantially normal to the axis of the diode,
wherein a width of the conical part reduces as a distance from the first convex surface increases.

9. A radiation reforming lens having four surfaces on a common axis collinear with the axis of a light emitting diode, comprising:
a first light admitting surface having central and peripheral zones, said first surface having a convex shape, said central zone being disposed close to said axis;
a second light admitting surface, said second surface being curved;
a third surface, said third surface being a light exiting surface forming a conical part into which radiation enters from said first light admitting surface; a fourth surface, said fourth surface being a light exiting surface disposed to receive radiation from said second light admitting surface, wherein said light exiting from said third and fourth surface is substantially normal to said axis, wherein a width of the conical part reduces as a distance from the first convex surface increases.

10. The radiation reforming lens of claim 9 wherein said second light admitting surface is cylindrical.

11. The radiation reforming lens of claim 9 wherein said fourth light exiting surface is curved.

12. The radiation reforming lens of claim 9 wherein said fourth light exiting surface is aspheric.

13. The radiation reforming lens of claim 9 wherein the curvature of said fourth light exiting surface is a function of distance along its major diameter.

* * * * *